United States Patent
Cao et al.

(10) Patent No.: US 9,502,324 B2
(45) Date of Patent: Nov. 22, 2016

(54) ELECTRONIC DEVICE

(75) Inventors: Weijie Cao, Beijing (CN); Shenghua Xi, Beijing (CN); Li Fang, Beijing (CN)

(73) Assignees: LENOVO (BEIJING) LIMITED, Beijing (CN); BEIJING LENOVO SOFTWARE LTD., Beijing (CN)

(*) Notice: Subject to any disclaimer, the term of this patent is extended or adjusted under 35 U.S.C. 154(b) by 63 days.

(21) Appl. No.: 13/613,744

(22) Filed: Sep. 13, 2012

(65) Prior Publication Data
US 2013/0077233 A1    Mar. 28, 2013

(30) Foreign Application Priority Data
Sep. 23, 2011  (CN) .......................... 2011 1 0286869

(51) Int. Cl.
| H05K 7/20 | (2006.01) |
| G06F 1/20 | (2006.01) |
| H01L 23/36 | (2006.01) |

(52) U.S. Cl.
CPC ....... *H01L 23/36* (2013.01); *H01L 2924/0002* (2013.01)

(58) Field of Classification Search
CPC ............. H01L 23/36; H05K 7/20; G01F 1/20; G01F 1/16
USPC ......... 361/679.46, 679.54, 679.55, 688, 689, 361/704–715, 719–724, 816, 818, 831; 165/80.2, 80.3, 104.33, 185; 174/16.3, 174/50, 51, 520, 17 R, 35 MS; 312/223.2, 312/223.3, 236; 257/706–727
See application file for complete search history.

(56) References Cited

U.S. PATENT DOCUMENTS

| 5,272,375 | A | * | 12/1993 | Belopolsky | ......... H01L 23/3735 165/104.33 |
| 5,395,679 | A | * | 3/1995 | Myers et al. | ................. 428/209 |
| 5,504,372 | A | * | 4/1996 | Braden et al. | ................. 257/723 |
| 5,539,618 | A | * | 7/1996 | Wiesa et al. | ................. 361/720 |
| 5,679,457 | A | * | 10/1997 | Bergerson | ..................... 428/344 |
| 6,317,321 | B1 | * | 11/2001 | Fitch et al. | ................... 361/700 |
| 6,324,055 | B1 | * | 11/2001 | Kawabe | ................ G06F 1/1616 361/679.54 |
| 6,400,571 | B1 | * | 6/2002 | Kimura | ..................... G06F 1/18 165/185 |
| 6,965,071 | B2 | * | 11/2005 | Watchko et al. | ............. 174/377 |

(Continued)

FOREIGN PATENT DOCUMENTS

| CN | 1487786 A | 4/2004 |
| CN | 2743974 Y | 11/2005 |

(Continued)

OTHER PUBLICATIONS

English abstract of CN1487786A, dated Apr. 7, 2004; 1 page.

(Continued)

*Primary Examiner* — Michail V Datskovskiy

(57) ABSTRACT

An electronic device having a heat generating element and a housing is provided including a heat dissipation arrangement provided between the heat generating element and the housing, the heat dissipation arrangement comprising a first layer in contact with the heat generating element and a second layer provided on top of the first layer and being in contact with the housing, the first layer having higher heat conductivity than the second layer, the second layer preventing heat from rapidly passing through such that the heat can be diffused in the first layer.

3 Claims, 3 Drawing Sheets

(56) References Cited

U.S. PATENT DOCUMENTS

| | | | |
|---|---|---|---|
| 6,987,671 B2 * | 1/2006 | Houle | 361/704 |
| 6,996,425 B2 * | 2/2006 | Watanabe | H04M 1/18 379/433.01 |
| 7,066,244 B2 * | 6/2006 | Chen et al. | 165/185 |
| 7,141,310 B2 * | 11/2006 | Adams et al. | 428/614 |
| 7,161,809 B2 * | 1/2007 | Ford et al. | 361/719 |
| 7,228,894 B2 * | 6/2007 | Moore et al. | 165/185 |
| 7,239,519 B2 * | 7/2007 | Guo | H05K 7/20509 361/714 |
| 7,480,145 B2 * | 1/2009 | Ali | 361/708 |
| 7,623,349 B2 * | 11/2009 | Refai-Ahmed et al. | 361/719 |
| 7,806,166 B1 * | 10/2010 | Tilton et al. | 165/58 |
| 8,319,108 B2 * | 11/2012 | Yamaguchi et al. | 174/252 |
| 8,363,398 B2 * | 1/2013 | Tan | G06F 1/203 361/679.54 |
| 8,363,407 B2 * | 1/2013 | Yamamoto et al. | 361/705 |
| 8,570,747 B2 * | 10/2013 | Cheng et al. | 361/714 |
| 2003/0043541 A1 * | 3/2003 | Yuasa et al. | 361/687 |
| 2005/0006083 A1 * | 1/2005 | Chen et al. | 165/185 |
| 2005/0241817 A1 * | 11/2005 | Moore | H01L 23/36 165/185 |
| 2005/0281994 A1 * | 12/2005 | Tani | H01L 23/142 428/209 |
| 2006/0000591 A1 * | 1/2006 | Adams et al. | 165/185 |
| 2006/0056157 A1 | 3/2006 | Ford et al. | |
| 2008/0101026 A1 * | 5/2008 | Ali | 361/708 |
| 2008/0151503 A1 * | 6/2008 | Aapro | H04M 1/026 361/714 |
| 2010/0142154 A1 * | 6/2010 | Collet et al. | 361/714 |
| 2010/0309631 A1 | 12/2010 | Hill et al. | |
| 2011/0157806 A1 | 6/2011 | Yamamoto et al. | |
| 2011/0235255 A1 * | 9/2011 | Cheng et al. | 361/679.02 |
| 2011/0256326 A1 * | 10/2011 | Mundt et al. | 428/34.1 |
| 2012/0145375 A1 * | 6/2012 | Beasley | C07C 209/02 165/277 |
| 2013/0034818 A1 * | 2/2013 | Beasley | C07C 209/02 432/9 |

FOREIGN PATENT DOCUMENTS

| | | | | |
|---|---|---|---|---|
| CN | 2884809 Y | 3/2007 | | |
| CN | 200997743 Y | 12/2007 | | |
| CN | 101529359 A | 9/2009 | | |
| CN | 201550395 U | 8/2010 | | |
| JP | 02007059875 A | * | 3/2007 | H01L 23/373 |
| WO | WO2008041274 A1 | * | 4/2008 | H01M 8/04007 |

OTHER PUBLICATIONS

English abstract of CN2743974Y, dated Nov. 30, 2005; 1 page.
English abstract of CN2884809Y, dated Mar. 28, 2007; 1 page.
English abstract of CN101529359A, dated Sep. 9, 2009; 1 page.
English abstract of CN200997743Y, dated Dec. 26, 2007; 1 page.
English abstract of CN201550395U, dated Aug. 11, 2010; 1 page.

* cited by examiner

ELECTRONIC DEVICE

TECHNICAL FIELD

The present invention relates to electronic devices.

BACKGROUND

The performance and user experience of an electronic device is directly affected by its heat dissipation capability. One of common approaches of heat dissipation for an electronic device is to mount a fan for a heat generating element. However, with the trend for electronic devices to become thinner and lighter, such approach may either cause high temperature at the housing due to small space within a thin and light electronic device, or cause increased noise due to higher rotation speed of the fan required for higher capability of heat dissipation. Currently, in order to provide improved heat dissipation for a thin and light electronic device, a heat insulating or heat conductive material can be used as a heat dissipation layer between the heat generating element and the housing, which, however, leads to another problem. Since some heat generating elements may generate a large amount of heat in a short time, there will be an excessively high temperature in areas where the heat dissipation layer of heat insulating material contacts these heat generating elements. Due to the slow heat conduction rate of the heat insulating material, such areas may have increasingly higher temperature, resulting in local overheated areas from which heat will be directly conducted to the housing of the electronic device. On the other hand, the heat dissipation layer of heat conductive material may, due to its high heat conduction rate, cause heat to be directly conducted to the housing before there is enough time for dissipation of local high temperature, which in turn creates local overheated areas on the housing. Thus, such conventional heat dissipation layers will create locally overheated areas on the housing that may be touched by the user, thereby worsening the user's experience.

SUMMARY

An object of the present invention is to provide an electronic device capable of solving at least the above problem that the conventional electronic device with a heat dissipation layer may create locally overheated areas on the housing that may be touched by the user, thereby worsening the user's experience.

According to an aspect of the present invention, an electronic device is provided, which has a heat generating element and a housing. The electronic device includes a heat dissipation arrangement provided between the heat generating element and the housing. The heat dissipation arrangement includes a first layer in contact with the heat generating element, and a second layer provided on top of the first layer and being in contact with the housing. The first layer has a higher heat conductivity than the second layer. The second layer is used to prevent heat from rapidly passing through the second layer such that the heat can be diffused within the first layer.

In an embodiment, the area of the first layer is equal to or smaller than the area of the second layer.

According to another aspect of the present invention, an electronic device is provided, which has a heat generating element and a housing. The electronic device includes a heat dissipation arrangement provided between the heat generating element and the housing. The heat dissipation arrangement includes a first layer in contact with the heat generating element, a third layer in contact with the housing, and a second layer provided between the first layer and the third layer. The first layer and the third layer each have a higher heat conductivity than the second layer. The second layer is used to prevent heat from rapidly passing through the second layer such that the heat can be diffused within the first layer.

In an embodiment, the area of the first layer is equal to or smaller than the area of the second layer.

In an embodiment, the area of the second layer is equal to or smaller than the area of the third layer.

In an embodiment, the first layer is made of a heat conductive material and the second layer is made of a heat insulating material.

In an embodiment, the third layer is made of a heat conductive material.

According to another aspect of the present invention, an electronic device is provided having a heat generating element. The electronic device includes a heat dissipation housing in contact with the heat generating element. The heat dissipation housing includes an inner layer in contact with the heat generating element, and an outer layer attached to the inner layer. The inner layer has a higher heat conductivity than the outer layer. The outer layer is used to prevent heat from rapidly passing through the outer layer such that the heat can be diffused within the inner layer.

In an embodiment, the inner layer is made of a heat conductive material and the outer layer is made of a heat insulating material.

According to another aspect of the present invention, an electronic device is provided having a heat generating element. The electronic device includes a heat dissipation housing in contact with the heat generating element. The heat dissipation housing includes an inner layer in contact with the heat generating element, an intermediate layer attached to the inner layer, and an outer layer attached to the intermediate layer. The inner layer and the outer layer each have a higher heat conductivity than the intermediate layer. The intermediate layer is used to prevent heat from rapidly passing through the intermediate layer such that the heat can be diffused within the inner layer.

In an embodiment, the inner layer and the outer layer are each made of a heat conductive material, and the intermediate layer is made of a heat insulating material.

In an embodiment, the electronic device includes a laptop computer, a mobile communication terminal or a tablet computer.

With the electronic device according to embodiments of the present invention, the heat dissipation arrangement composed of heat conduction layers having different heat conductivities is in contact with the heat generating element in the electronic device, and a large amount of heat generated by the heat generating element can be conducted in a rapid and uniform manner, thereby preventing locally overheated areas from being created on the housing touched by the user, and improving the user's experience.

BRIEF DESCRIPTION OF THE DRAWINGS

To clearly illustrating the solutions of embodiments of the present invention, figures for explanation of embodiments will be briefly introduced below. Apparently, the following figures are only some of the embodiments of the present invention. Those skilled in the art can derive other figures from the following figures.

DETAILED DESCRIPTION OF THE PREFERRED EMBODIMENTS

In order to prevent the user from sensing locally overheated areas on the housing in use, electronic devices of the present invention incorporate a heat dissipation arrangement in contact with the heat generating element to conduct the heat generated from the heat generating element uniformly. The heat dissipation arrangement is composed of two or three layers having different heat conductivities. The heat dissipation arrangement can be provided between the heat generating element and the housing. Alternatively, the heat dissipation arrangement itself can be used as the housing.

In the following, embodiments of the present invention will be described clearly and thoroughly with reference to the figures. Apparently, the embodiments given below are only some, rather than all, of embodiments of the present invention. In light of embodiments of the present invention, those skilled in the art can contemplate other embodiments without any undue effort, and these embodiments are also encompassed by the scope of the present invention.

Figure 1:
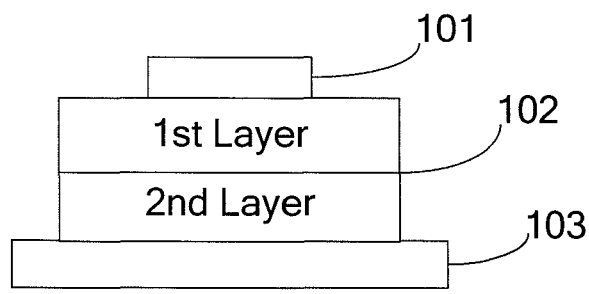
FIG. 1 is a schematic diagram illustrating the structure of an electronic device according to an embodiment of the present invention.

As shown in FIG. 1, an electronic device according to the present invention includes a heat generating element 101, a housing 103 and a heat dissipation arrangement 102 provided between the heat generating element and the housing. The heat dissipation arrangement 102 includes a first layer in contact with the heat generating element, and a second layer provided on top of the first layer and being in contact with the housing.

The first layer has a higher heat conductivity than the second layer, and is used to rapidly conduct the heat generated by the heat generating element in contact. The second layer prevents the heat conducted into the first layer from rapidly passing through the second layer such that the heat can be uniformly diffused or dispersed in the first layer. The second layer also slowly conducts the uniformly diffused heat to the housing. In this way, areas for dissipating the heat can be maximized.

In this embodiment, the second layer can be attached to the top of the first layer. The second layer can be, for example, glued on top of the first layer. This may depend on actual implementations.

According to the present invention, by using the heat conduction layers having different heat conductivities in the heat dissipation arrangement, the heat generated inside the electronic device can be rapidly conducted and uniformly distributed. Thus, no locally overheated area will be created on the housing. In this way, when touching the housing, the user will not sense any overheated area, and thus the user's experience can be improved.

Figure 2:
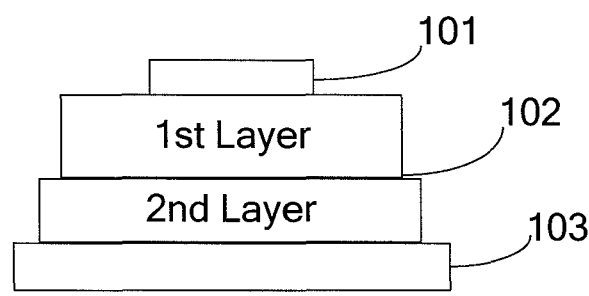
FIG. 2 is a schematic diagram illustrating the structure of another electronic device according to an embodiment of the present invention.

In FIG. 1, the area of the first layer can be equal to the area of the second layer in the heat dissipation arrangement. Further, as shown in FIG. 2, the area of the first layer can be smaller than the area of the second layer. The larger the area of each layer is, the larger the area for heat conduction and distribution will be, which is advantageous for heat dissipation of the electronic device.

In the above embodiment, the heat dissipation arrangement is composed of two layers, which facilitates cost reduction while ensuring heat dissipation effects. However, the second layer has a low heat conductivity and thus a low heat dissipation rate to the outside. If the heat dissipation rate needs to be considered in addition to the uniformity of heat dissipation, the heat dissipation arrangement may be composed of three layers as described below.

Figure 3:
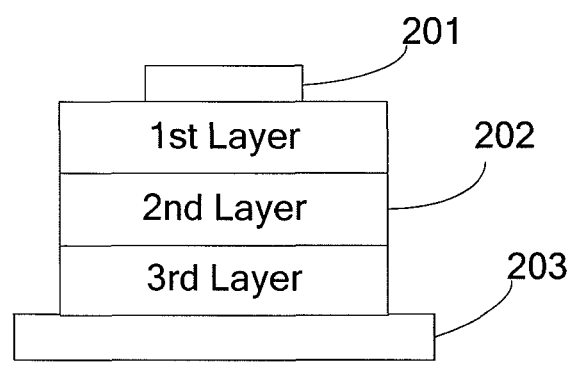
FIG. 3 is a schematic diagram illustrating the structure of another electronic device according to an embodiment of the present invention.

As shown in FIG. 3, another electronic device according to the present invention includes a heat generating element 201, a housing 203, and a heat dissipation arrangement 202 provided between the heat generating element and the housing. The heat dissipation arrangement includes a first layer in contact with the heat generating element, a third layer in contact with the housing, and a second layer provided between the first layer and the third layer.

The first layer and the third layer each have a higher heat conductivity than the second layer. The first layer is used to rapidly conduct the heat generated by the heat generating element in contact with it. The second layer prevents the heat conducted into the first layer from rapidly passing through the second layer such that the heat can be uniformly dispersed in the first layer. The second layer also slowly conducts the uniformly dispersed heat. The third layer is used to rapidly conduct the uniform heat on the second layer to the housing, such that the heat can be rapidly dissipated to the outside through a region of the maximum area.

Again, in this embodiment, the three layers of the heat dissipation arrangement are preferably, but not limited to, attached together.

Compared with the above embodiment, the heat dissipation arrangement of this embodiment incorporates an additional third layer between the second layer and the housing, so as to rapidly conduct to the outside the heat uniformly conducted into the second layer. In this way, the electronic device enables uniform and rapid heat dissipation.

Further, according to this embodiment, the areas of the respective layers in the heat dissipation arrangement can be configured in various ways.

The area of the first layer can be equal to or smaller than the area of the second layer.

Further, the area of the third layer can be equal to or larger than the area of the second layer.

Figure 4:
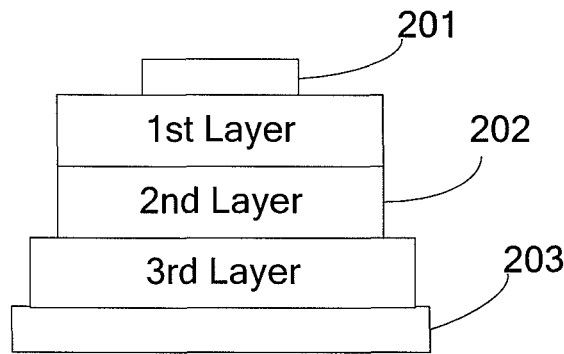
FIG. 4 is a schematic diagram illustrating the structure of another electronic device according to an embodiment of the present invention.
Figure 5:
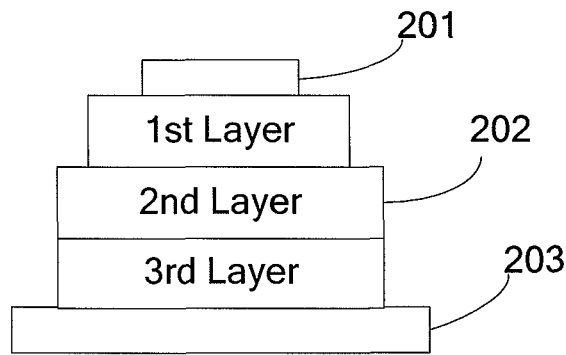
FIG. 5 is a schematic diagram illustrating the structure of another electronic device according to an embodiment of the present invention.
Figure 6:
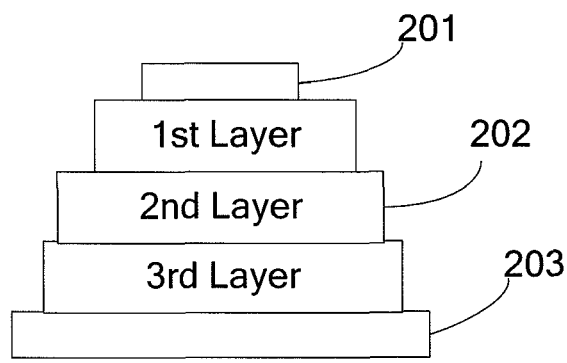
FIG. 6 is a schematic diagram illustrating the structure of another electronic device according to an embodiment of the present invention.

In other words, the three layers of the heat dissipation arrangement may have four different configurations in terms of area. The three layers may have equal areas, as shown in FIG. 3. The first layer and the second layer may have equal areas, which are smaller than the area of the third layer, as shown in FIG. 4. The second layer and the third layer may have equal areas, which are larger than the area of the first layer, as shown in FIG. 5. Alternatively, the area of the first layer may be smaller than the area of the second layer, which is further smaller than the area of the third layer, as shown in FIG. 6.

Further, in the previous embodiments, the first layer of the heat dissipation arrangement in contact with the heat generating element is made of a heat conductive material, such that the heat can be rapidly conducted with the high conductivity of the conductive material. The second layer provided on top of the first layer is made of a heat insulating material, such that the rate at which the heat is conducted to the outside can be slowed down with the heat insulation characteristic of the heat insulating material. Thus, the heat can be dissipated and distributed uniformly in the first layer and then slowly conducted to the outside in a sufficient area.

On the other hand, the three-layer heat dissipation arrangement further includes a third layer made of a heat conductive material to rapidly dissipate the heat which is slowly conducted by the second layer to the outside. In this way, the heat can be dissipated rapidly and uniformly through a large area.

Here, the heat conductive material can be copper, aluminum or graphite. The heat insulating material can be fiberglass-type airgel or paint-type airgel. However, the heat conductive or insulating material is not limited to the above.

In electronic device according to the above embodiments, a heat dissipation arrangement is additionally provided between the heat generating element and the housing. However, for an electronic device having limited thickness, the heat dissipation arrangement may be directly used as the housing.

Figure 7:
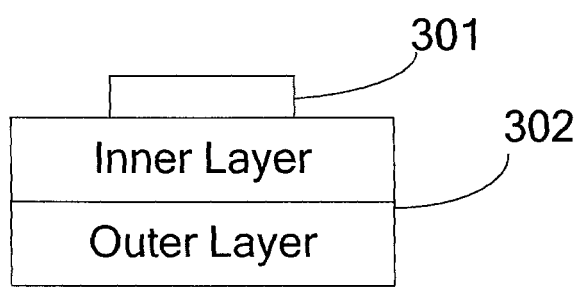
FIG. 7 is a schematic diagram illustrating the structure of another electronic device according to an embodiment of the present invention.

As shown in FIG. 7, a further electronic device according to the present invention includes a heat generating element 301, and a heat dissipation housing 302 in contact with the heat generating element. The heat dissipation housing includes an inner layer in contact with the heat generating element, and an outer layer closely attached to the inner layer.

The inner layer has a higher heat conductivity than the outer layer, and is used to rapidly conduct the heat generated by the heat generating element. The outer layer prevents the heat conducted into the inner layer from rapidly passing through the outer layer, such that the heat can be first uniformly dispersed in the inner layer and then slowly conducted to the outside.

The electronic device according to this embodiment is provided with a heat dissipation housing including two heat conduction layers having different heat conductivities. The housing has a good heat dissipation performance. In this way, the requirements on uniform and rapid heat dissipation for the electronic device can be satisfied without additional heat dissipation arrangement. At the same time, the requirement of a compact electronic device can also be satisfied.

Further, the inner layer of the heat dissipation arrangement is made of a heat conductive material such as copper, aluminum or graphite. The outer layer is made of a heat insulating material such as fiberglass-type airgel or paint-type airgel.

Similar to the above heat dissipation arrangement provided between the heat generating element and the housing, in order to dissipate the heat rapidly to the outside, the heat dissipation housing can also include three layers.

Figure 8:
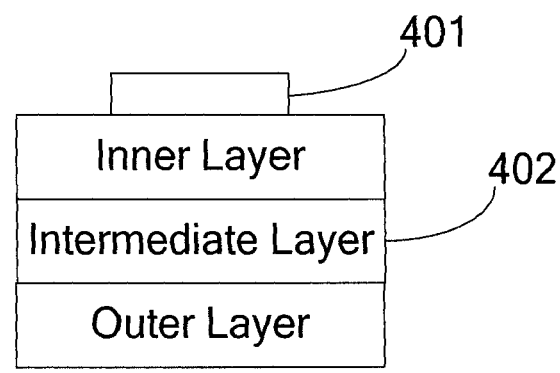
FIG. 8 is a schematic diagram illustrating the structure of another electronic device according to an embodiment of the present invention.

As shown in FIG. 8, a still further electronic device according to the present invention includes a heat generating element 401 and a heat dissipation housing 402. The heat dissipation housing includes an inner layer in contact with the heat generating element, an intermediate layer closely attached to the inner layer, and an outer layer closely attached to the intermediate layer.

The inner layer and the outer layer each have a higher heat conductivity than the intermediate layer. The inner layer is used to rapidly conduct the heat generated by the heat generating element in contact with it. The intermediate layer prevents the heat conducted into the inner layer from rapidly passing through the intermediate layer, such that the heat can be uniformly dispersed in the inner layer. The intermediate layer also slowly conducts the uniformly dissipated heat. The outer layer is used to rapidly conduct the uniform heat on the intermediate layer, such that the heat uniformly distributed on the intermediate layer can be rapidly dissipated to the outside.

In this embodiment, the electronic device is provided with a heat dissipation housing composed of three layers, which has a higher heat dissipation rate than the two-layer heat dissipation housing.

Further, the inner and outer layers of the heat dissipation arrangement are made of a heat conductive material such as copper or graphite. The intermediate layer is made of a heat insulating material such as fiberglass-type airgel or paint-type airgel.

In the above embodiments, the electronic device having a heat dissipation arrangement or a heat dissipation housing have been described. The electronic device can be in particular a laptop computer (Laptop), a mobile communication terminal (Phone) or a tablet computer (Pad).

These are portable electronic devices which physically contact the user in use. For example, a Laptop is typically placed on the user's lap, while a Phone or a Pad typically contacts the user's palm. There is thus generally a high requirement on the heat dissipation from such portable electronic devices, so as to prevent the user from sensing a high temperature on the housing, particularly on the position where the user's palm holds the device.

By providing a heat dissipation arrangement including two or three heat dissipation layer having different heat conductivities between the heat generating element of various electronic devices, such as CPU, and the housing, or by providing a heat dissipation housing including two or three heat dissipation layer having different heat conductivities, it is possible to maximize the effective heat dissipation area for heat generated by the heat generating element and dissipate the heat uniformly to the outside, so as to prevent the user from sensing any locally overheated area on the housing.

The various embodiments of the present invention have been described The description of each embodiment is focused on the difference between that embodiment and other embodiments. The individual embodiments can be referenced to each other for the same or similar elements.

With the above disclosure of the embodiments, those skilled in the art are enabled to implement or use the present invention. Various modifications of these embodiments will be apparent to those skilled in the art. The general principle of the present invention can be implemented in other embodiments without departing from the spirit or scope of the present invention. Therefore, the present invention is not limited to the above disclosed embodiments, but is intended to cover a broad scope in compliance with the principle and inventive concept of the present invention.

What is claimed is:

1. An electronic device having a heat generating element and a housing, comprising:
   a heat dissipation arrangement provided between the heat generating element and the housing, the heat dissipation arrangement comprising a first layer in contact with the heat generating element, and a second layer provided on top of the first layer and being in contact with the housing, the first layer has a higher heat conductivity than the second layer, and the second layer is for preventing heat from rapidly passing through the second layer such that the heat is diffused within the first layer, wherein the area of the first layer is smaller than the area of the second layer.

2. The electronic device of claim 1, wherein the first layer is made of a heat conductive material, and the second layer is made of a heat insulating material.

3. The electronic device of claim 1, wherein the electronic device comprises a laptop computer, a mobile communication terminal or a tablet computer.

* * * * *